United States Patent
Sottke et al.

(10) Patent No.: US 9,994,717 B2
(45) Date of Patent: Jun. 12, 2018

(54) CVD-COATED ARTICLE AND CVD PROCESS OF MAKING THE SAME

(71) Applicant: Kennametal Inc., Latrobe, PA (US)

(72) Inventors: Volkmar Sottke, Ruhr (DE); Hartmut Westphal, Dermbach (DE); Karl H. Wendt, Ebermannstadt (DE); Peter R. Leicht, Latrobe, PA (US); Rodrigo A. Cooper, Latrobe, PA (US); Yixiong Liu, Greensburg, PA (US)

(73) Assignee: KENNAMETAL INC., Latrobe, PA (US)

( * ) Notice: Subject to any disclaimer, the term of this patent is extended or adjusted under 35 U.S.C. 154(b) by 181 days.

(21) Appl. No.: 14/684,717

(22) Filed: Apr. 13, 2015

(65) Prior Publication Data

US 2016/0298233 A1    Oct. 13, 2016

(51) Int. Cl.
  *C23C 16/04* (2006.01)
  *C09D 1/00* (2006.01)
  *C23C 16/30* (2006.01)
  *C23C 16/34* (2006.01)
  (Continued)

(52) U.S. Cl.
  CPC ............... *C09D 1/00* (2013.01); *C23C 16/30* (2013.01); *C23C 16/34* (2013.01); *C23C 16/36* (2013.01); *C23C 28/042* (2013.01); *C23C 28/044* (2013.01)

(58) Field of Classification Search
  USPC .......... 51/307, 309; 428/697, 698, 699, 701, 428/702
  See application file for complete search history.

(56) References Cited

U.S. PATENT DOCUMENTS

| | | | | |
|---|---|---|---|---|
| 4,264,682 A | * | 4/1981 | Fuyama | .................. C23C 16/32 428/698 |
| 5,700,551 A | * | 12/1997 | Kukino | ............... C04B 35/5831 51/309 |
| 8,043,729 B2 | | 10/2011 | Sundstrom et al. | |

(Continued)

FOREIGN PATENT DOCUMENTS

| JP | 6256564 | * | 3/1987 |
|---|---|---|---|
| WO | WO0022187 | * | 4/2000 |

OTHER PUBLICATIONS

Kimura, Ayako et al.; Anisotropic lattice expansion and shrinkage of hexagonal TiAlN and CrAlN films; Surface & Coatings Technology 169-170, (2003); pp. 367-370.

(Continued)

*Primary Examiner* — Archene Turner
(74) *Attorney, Agent, or Firm* — Larry R. Meenan

(57) ABSTRACT

A CVD-coated article has a substrate with a substrate surface and a CVD coating scheme on the substrate surface. The coating scheme includes a coating layer of $Ti_{1-x}Me_x$ nitride wherein Me is selected from the group of zirconium or hafnium or a mixture of zirconium and hafnium, and x equals between about 0.1 and about 0.9. The coating layer of $Ti_{1-x}Me_x$ nitride has a microhardness equal to between about 2300 HV0.05 and about 2600 HV0.05, a face centered cubic crystal structure, and a lattice constant equal to between about 0.427 nanometers and about 0.453 nanometers.

23 Claims, 11 Drawing Sheets
(4 of 11 Drawing Sheet(s) Filed in Color)

(51) Int. Cl.
  *C23C 16/36* (2006.01)
  *C23C 28/04* (2006.01)

(56) References Cited

U.S. PATENT DOCUMENTS

2010/0260561 A1* 10/2010 Moriguchi .......... C23C 14/0036
  407/119
2010/0323176 A1* 12/2010 Van Den Berg ...... C23C 30/005
  428/697
2011/0003126 A1* 1/2011 Van Den Berg ........ C23C 16/24
  428/697

OTHER PUBLICATIONS

Quinto, D.T. et al., Mechanical Properties, Structure and Performance of Chemically Vapor-deposited and Physically Vapor-deposited Coated Carbide Tools; Materials Science and Engineering, A105/106 (1988); pp. 443-452.

Kim, Kwang Ho et al., Comparative Studies of TiN and Ti-xAlxN by Plasma-Assisted Chemical Vapor Deposition Using a TiCl4/AlCl3/N2/H2/Ar Gas Mixture, Thin Solid Films 283 (1996), pp. 165-170.

Shimada, Shiro et al., Preparation of (Ti1-xAlx)N Films from Mixed Alkoxide Solutions by Plasma CVD, Thin Solid Films 370 (2000), pp. 146-150.

* cited by examiner

1 µm

CVD-COATED ARTICLE AND CVD PROCESS OF MAKING THE SAME

BACKGROUND

The present invention pertains to a CVD-coated article, such as, for example, a CVD-coated cutting insert, coated via a chemical vapor deposition (CVD) process, as well as the CVD process of making the CVD-coated article. More specifically the invention pertains to a CVD-coated article, such as, for example, a CVD-coated cemented carbide cutting insert, coated via a chemical vapor deposition (CVD) process, as well as the CVD process of making the CVD-coated article wherein the CVD coating scheme includes at least one CVD coating layer of $(Ti_{1-x}Me_x)N$ wherein Me is either Zr alone or Hf alone or a mixture of Zr and Hf. The $(Ti_{1-x}Me_x)N$ coating layer has a face-centered cubic crystal structure and the lattice constant is dependent on the Ti:Me composition. The inventive CVD process itself includes the step of depositing the $(Ti_{1-x}Me_x)N$ coating layer by reacting $TiCl_4$ and $ZrCl_4$ and/or $HfCl_4$ with $NH_3$ in the presence of $H_2$.

Heretofore, CVD-coated articles (e.g., CVD-coated cutting inserts) have included a coating scheme that had a TiN coating layer or a ZrN coating or a HfN coating layer. One exemplary patent document is U.S. Pat. No. 8,043,729 to Sundstrom et al. that mentions in a list a thin ZrN or HfN colored top layer deposited by CVD technique. See Col. 4, lines 58-61.

SUMMARY OF THE INVENTION

In one form thereof, the invention is a CVD-coated article that comprises a substrate that has a substrate surface. A CVD coating scheme is on the substrate surface. The coating scheme comprises a coating layer of $Ti_{1-x}Me_x$ nitride wherein Me is selected from the group consisting essentially of zirconium or hafnium or a mixture of zirconium and hafnium, and x equals between about 0.1 and about 0.9. The coating layer of $Ti_{1-x}Me_x$ nitride has a microhardness equal to between about 2300 HV0.05 and about 2600 HV0.05. The coating layer of $Ti_{1-x}Me_x$ nitride has a face centered cubic crystal structure. The coating layer of $Ti_{1-x}Me_x$ nitride has a lattice constant equal to between about 0.427 nanometers and about 0.453 nanometers.

In another form thereof, the invention is a CVD-coated article that comprises a substrate that has a substrate surface. A CVD coating scheme is on the substrate surface. The coating scheme comprises a coating layer of $Ti_{1-x}Zr_x$ nitride. The coating layer of $Ti_{1-x}Zr_x$ nitride has a microhardness equal to between about 2300 HV0.05 and about 2600 HV0.05. The coating layer of $Ti_{1-x}Zr_x$ nitride has a face centered cubic crystal structure. The coating layer of $Ti_{1-x}Zr_x$ nitride has a lattice constant equal to between about 0.427 nanometers and about 0.453 nanometers.

In yet another form thereof, the invention is a CVD-coated article comprising a substrate having a substrate surface and a CVD coating scheme on the substrate surface. The coating scheme comprises a coating layer of $Ti_{1-x}Hf_x$ nitride. The coating layer of $Ti_{1-x}Hf_x$ nitride has a microhardness equal to between about 2300 HV0.05 and about 2600 HV0.05. The coating layer of $Ti_{1-x}Hf_x$ nitride has a face centered cubic crystal structure. The coating layer of $Ti_{1-x}Hf_x$ nitride has a lattice constant equal to between about 0.427 nanometers and about 0.449 nanometers.

In another form thereof, the invention is a process for making a CVD-coated article comprising the steps of: providing a substrate wherein the substrate has a substrate surface; and depositing a coating layer of $Ti_{1-x}Me_x$ nitride wherein Me is zirconium or hafnium or a mixture of zirconium and hafnium wherein a gaseous mixture to deposit zirconium comprises hydrogen and $TiCl_4$ and $ZrCl_4$ and $NH_3$ and nitrogen and argon, a gaseous mixture to deposit hafnium comprises hydrogen and $TiCl_4$ and $HfCl_4$ and $NH_3$ and nitrogen and argon, and a gaseous mixture to apply a mixture of zirconium and hafnium comprises hydrogen and TiCl4 and $ZrCl_4$ and $HfCl_4$ and $NH_3$ and nitrogen and argon.

BRIEF DESCRIPTION OF THE DRAWINGS

The patent or application file contains at least one drawing executed in color. Copies of this patent or application publication with color drawing(s) will be provided by the Office upon request and payment of the necessary fee.

Below is a brief description of the drawings that form a part of this patent application. The criticality of the features and merits of the present invention will be better understood by reference to the attached drawings. It is to be understood, however, that the drawings are designed for the purpose of illustration only and not as definitions of the limits of the present invention

DETAILED DESCRIPTION

Figure 1:
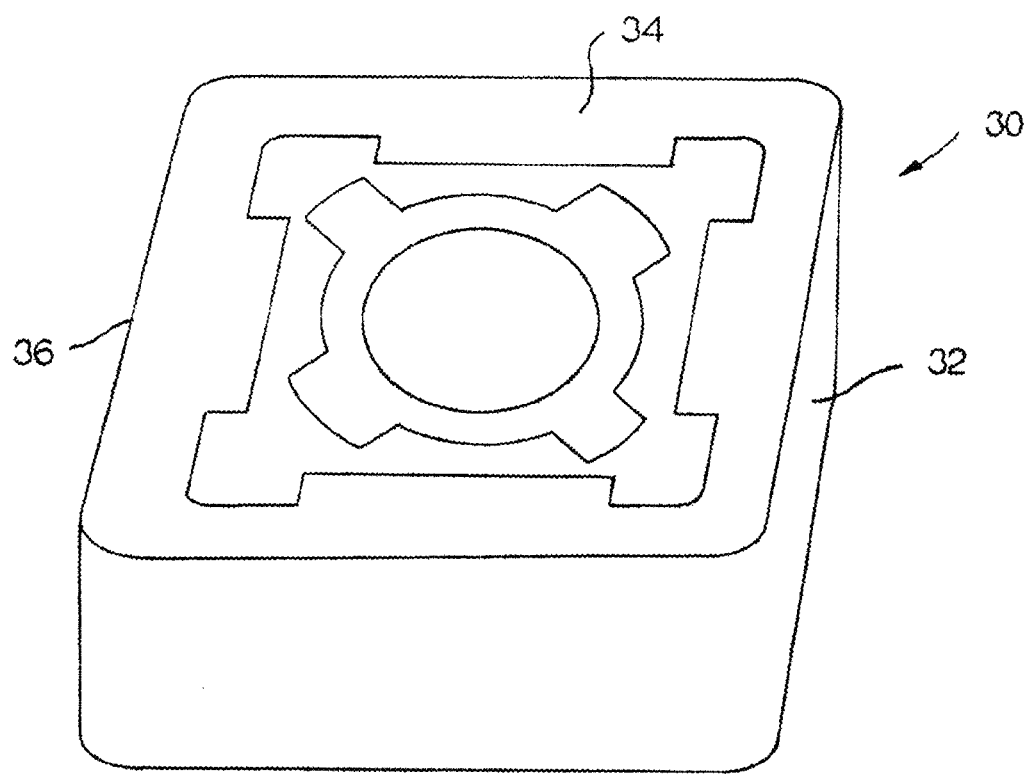
FIG. 1 is an isometric view of a specific embodiment of a CVD-coated cutting insert.

FIG. 1 is an isometric view of a specific embodiment of a CVD-coated cutting insert generally designated as 30. CVD-coated cutting insert 30 has a flank surface 32 and a rake surface 34 wherein the flank surface 32 and rake surface 34 intersect to form a cutting edge 36. There should be an appreciation that the CVD-coating cutting insert can take on many geometries wherein FIG. 1 illustrates a cutting insert with a CNMG432RP geometry.

Figure 2:
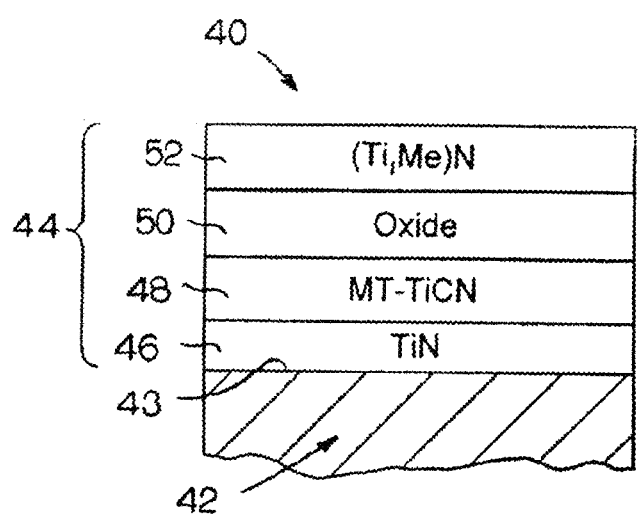
FIG. 2 is a cross-sectional schematic view of one specific embodiment of the inventive CVD-coated article (e.g., a CVD-coated cutting insert) showing the coating scheme and the substrate.

FIG. 2 is a cross-sectional view schematic view of one specific embodiment of an inventive CVD-coated cutting insert generally designated as 40. CVD-coated cutting insert 40 includes a substrate 42 (e.g., a cemented carbide such as WC/Co or WC/WTiTaNbC/Co or WC/WTiTaNbZrC/Co or Cermet) that has a coating scheme (see bracket 44) on the substrate surface 43. The coating scheme 42 comprises a base coating layer 46 of titanium nitride designated as "TiN". An inner mediate coating 48, which comprises moderate temperature-titanium carbonitride, which is designated as "MT-TiCN", is on the base coating layer 46. The MT-TiCN coating layer is deposited at a temperature between about 850° C. and about 950° C. An outer mediate coating layer 50, which is designated as "oxide" that is preferably aluminum oxide, is on the inner mediate coating layer 48. An outer coating layer 52, which is designated as "(Ti,Me)N", is on the outer mediate coating layer 50.

In reference to coating layer 52, the Me can be either Zr alone or Hf alone or a mixture of Zr and Hf. In the case of the Zr alone, the coating layer is $(Ti_{1-x}, Zr_x)N$ wherein x equals between about 0.1 and about 0.9. A narrower range for x is between about 0.4 and about 0.8. In the case of the Hf alone, the coating layer is $(Ti_{1-x}, Hf_x)N$ wherein x equals between about 0.1 and about 0.9. A narrower range for x is between about 0.3 and about 0.75. In the case where Me is a mixture of Zr and Hf, the coating layer coating layer is $(Ti_{1-(a+b)}Zr_aHf_b)N$, and "a" equals between about 0.1 and about 0.9 and "b" equals between about 0.1 and about 0.9. A narrower range for "a" is between about 0.3 and about 0.7. A narrower range for "b" is between about 0.3 and about 0.7.

Each one of the above coating layers is deposited by CVD. The thickness of each coating layer can be within narrow or intermediate or broader ranges such as set forth in Table 1 below.

TABLE 1

Ranges of Thicknesses for Coating Layer of FIG. 2

| Coating Layer | Narrow Thickness Range (micrometers (μm)) | Intermediate Thickness (micrometers (μm)) | Broader Thickness Range (micrometers (μm)) |
| --- | --- | --- | --- |
| TiN | 0.1-1.0 | 0.5 | 0.1-2.0 |
| MT-TiCN | 3.5-4.5 | 4 | 3-5 |
| Oxide | 3-4 | 3.5 | 2-5 |
| $(T_{1-x}Me_x)N$ | 1.5-2.5 | 2 | 1-3 |

Figure 3:
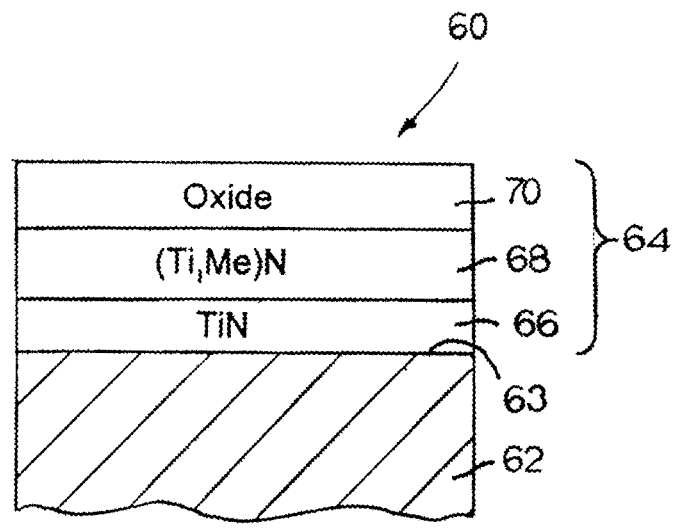
FIG. 3 is a cross-sectional schematic view of another specific embodiment of the inventive CVD-coated article (e.g., a CVD-coated cutting insert) showing the coating scheme and the substrate.

FIG. 3 is a cross-sectional view schematic view of another specific embodiment of CVD-coated cutting insert generally designated as 60. The CVD-coated cutting insert 60 comprises a substrate 62 (e.g., a cemented carbide such WC/Co or WC/WTiTaNbC/Co or WC/WTiTaNbZrC/Co or Cermet) that has a substrate surface 63. A coating scheme (see bracket 64) is on the surface 63 of the substrate 62. The coating scheme 64 includes a base coating layer 66, which is designated as "TiN", is on the surface 63 of the substrate 62. A mediate coating layer 68, which is designated as "(Ti,Me)N" is on the base coating layer 66. An outer coating layer 70, which is designated as "oxide" and preferably is aluminum oxide, is on the mediate coating layer 68.

In reference to mediate coating layer 68, the Me can be either Zr alone or Hf alone or a mixture of Zr and Hf. In the case of the Zr alone, the coating layer is $(Ti_{1-x}, Zr_x)N$ wherein x equals between about 0.1 and about 0.9. A narrower range for x is between about 0.4 and about 0.8. In the case of the Hf alone, the coating layer is $(Ti_{1-x}, Hf_x)N$ wherein x equals between about 0.1 and about 0.9. A narrower range for x is between about 0.3 and about 0.75. In the case where Me is a mixture of Zr and Hf, the coating layer coating layer is $(Ti_{1-(a+b)}Zr_aHf_b)N$, and "a" equals between about 0.1 and about 0.9 and "b" equals between about 0.1 and about 0.9. A narrower range for "a" is between about 0.3 and about 0.7. A narrower range for "b" is between about 0.3 and about 0.7.

Each one of the above coating layers is deposited by CVD. The thickness of each coating layer can be within narrow or intermediate or broader equals such as set forth in Table 2 below.

TABLE 2

Ranges of Thicknesses for Coating Layer of FIG. 3

| Coating Layer | Narrow Thickness Range (micrometers (μm)) | Intermediate Thickness (micrometers (μm)) | Broader Thickness Range (micrometers (μm)) |
| --- | --- | --- | --- |
| TiN | 0.1-1.0 | 0.5 | 0.1-2.0 |
| $(T_{1-x}Me_x)N$ | 3.5-4.5 | 4 | 3-5 |
| Oxide | 3-4 | 3.5 | 2-5 |

Figure 4:
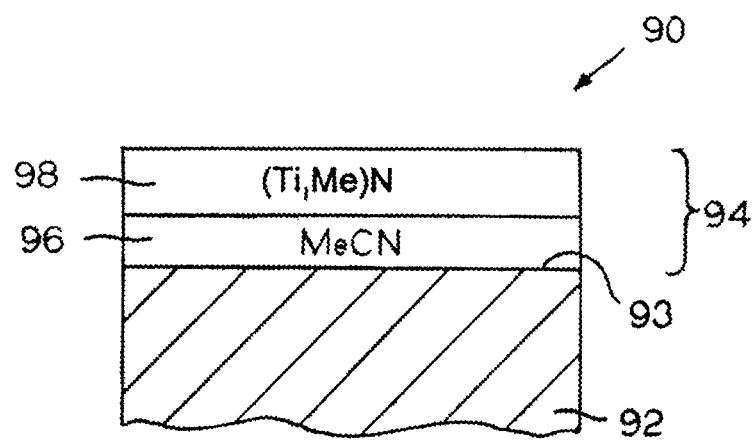
FIG. 4 is a cross-sectional schematic of another specific embodiment of an inventive CVD-coated article (e.g., a CVD-coated cutting insert) showing the coating scheme and the substrate.

FIG. 4 is a cross-sectional view schematic view of another specific embodiment of CVD-coated cutting insert generally designated as 90. The CVD-coated cutting insert 90 comprises a substrate 92 (e.g., a cemented carbide such a cemented (cobalt) tungsten carbide) that has a substrate surface 93. A coating scheme (see bracket 94) is on the surface 93 of the substrate 92. The coating scheme 94 has a base coating layer 96, which is designated as "MeCN", is on the surface 93 of the substrate 92. An outer coating layer 98, which is designated as "(Ti,Me)N" is on the base coating layer 96. In reference to outer coating layer 98, the Me can be either Zr alone or Hf alone or a mixture of Zr and Hf. In the case of the Zr alone, the coating layer is $(Ti_{1-x}, Zr_x)N$ wherein x equals between about 0.1 and about 0.9. A narrower range for x is between about 0.4 and about 0.8. In the case of the Hf alone, the coating layer is $(Ti_{1-x}, Hf_x)N$ wherein x equals between about 0.1 and about 0.9. A narrower range for x is between about 0.3 and about 0.75. In the case where Me is a mixture of Zr and Hf, the coating layer coating layer is $(Ti_{1-(a+b)}Zr_aHf_b)N$, and "a" equals between about 0.1 and about 0.9 and "b" equals between about 0.1 and about 0.9. A narrower range for "a" is between about 0.3 and about 0.7, and a narrower range for "b" is between about 0.3 and about 0.7.

Each one of the above coating layers is deposited by CVD. The thickness of each coating layer can be within narrow or intermediate or broader ranges such as set forth in Table 3 below.

TABLE 3

Ranges of Thicknesses for Coating Layer of FIG. 4

| Coating Layer | Narrow Thickness Range (micrometers (μm)) | Intermediate Thickness (micrometers (μm)) | Broader Thickness Range (micrometers (μm)) |
|---|---|---|---|
| MeCN | 3.5-4.5 | 4 | 3-5 |
| $(T_{1-x} Me_x)N$ | 3-4 | 3.5 | 2-5 |

Figure 5:
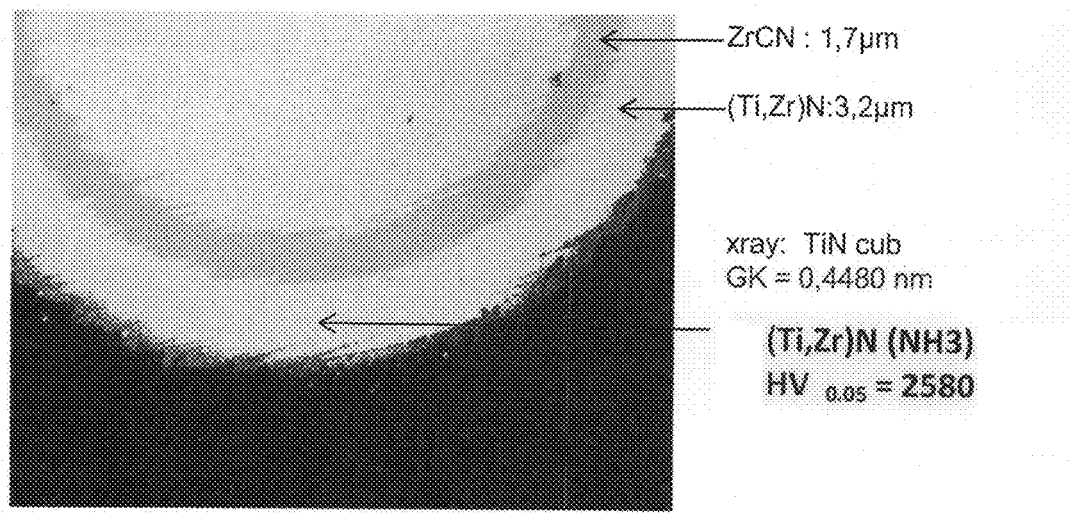
FIG. 5 is a photomicrograph with a magnification of 100× showing the coating layers of the coating scheme and substrate of a specific embodiment [Sample B2824] of the inventive CVD-coated article.

FIG. 5 is a photomicrograph with a magnification of 100× micrometers showing the coating scheme of a specific embodiment [Sample B2824] of an inventive CVD-coated article. The outer coating layer is designated as $(T_{1-x}Zr_x)N$ with x=0.66, and is a light orange color. The outer coating layer of (Ti,Zr)N has a thickness equal to 3.2 μm. The outer coating layer of (Ti,Zr)N has a microhardness equal to 2580 HV0.05 and a lattice constant equal to 0.447 nm. The coating scheme further has a base coating layer of ZrCN that is a light brown color and is of a thickness equal to 1.7 μm. The substrate, which is cemented carbide, is of light gray color. The chemical equilibrium reaction is: $\frac{1}{2}TiCl_4 + \frac{1}{2}ZrCl_4 + NH_3 + \frac{1}{2}H_2 \rightarrow (Ti_{0.5}Zr_{0.5})N + 4HCl$. At the same conditions basically ammonia can be replaced by hydrazine ($N_2H_4$), because hydrazine reacts with hydrogen to ammonia: $N_2H_4 + H_2 \rightarrow 2NH_3$.

Figure 6:
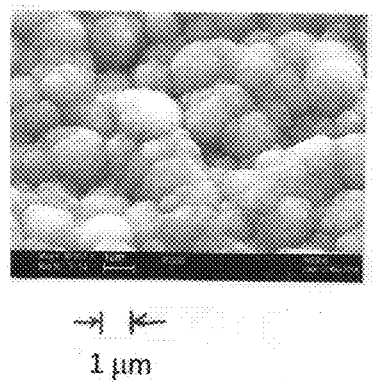
FIG. 6 is a SEM picture with a magnification of 10,000× (and a 1 μm scale) showing the surface grain morphology of another specific embodiment [Sample B2833] of the inventive CVD-coated article.
Figure 6A:
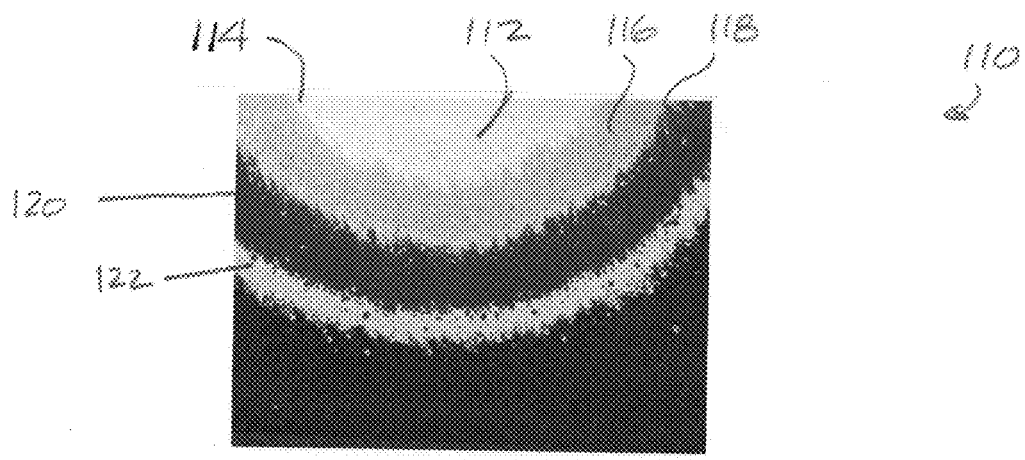
FIG. 6A is a photomicrograph with a magnification of 100× showing the coating scheme of Sample B2833.

FIG. 6 is a SEM picture with a magnification of 10,000× showing the surface grain morphology of another specific embodiment [Sample B2833] of the CVD-coated cutting insert. Referring to FIG. 6A, Sample B2833 cutting insert is generally designated as 110. Cutting insert 110 has a substrate 112, and the following coating scheme: a base coating layer 114 of TiN (0.3 μm thick), an inner mediate coating layer 116 of MT-TiCN (3.0 μm thick), an I.L. coating layer 118 (0.3 μm thick), an outer mediate coating layer 120 of α-Al2O3 (4.9 μm thick), and an outer coating layer 122 of $(T_{1-x}Zr_x)N$ with x=0.32 (1.9 μm thick). The overall coating scheme has a thickness equal to 10.4 μm. The surface grain morphology is fine grained.

Figure 7:
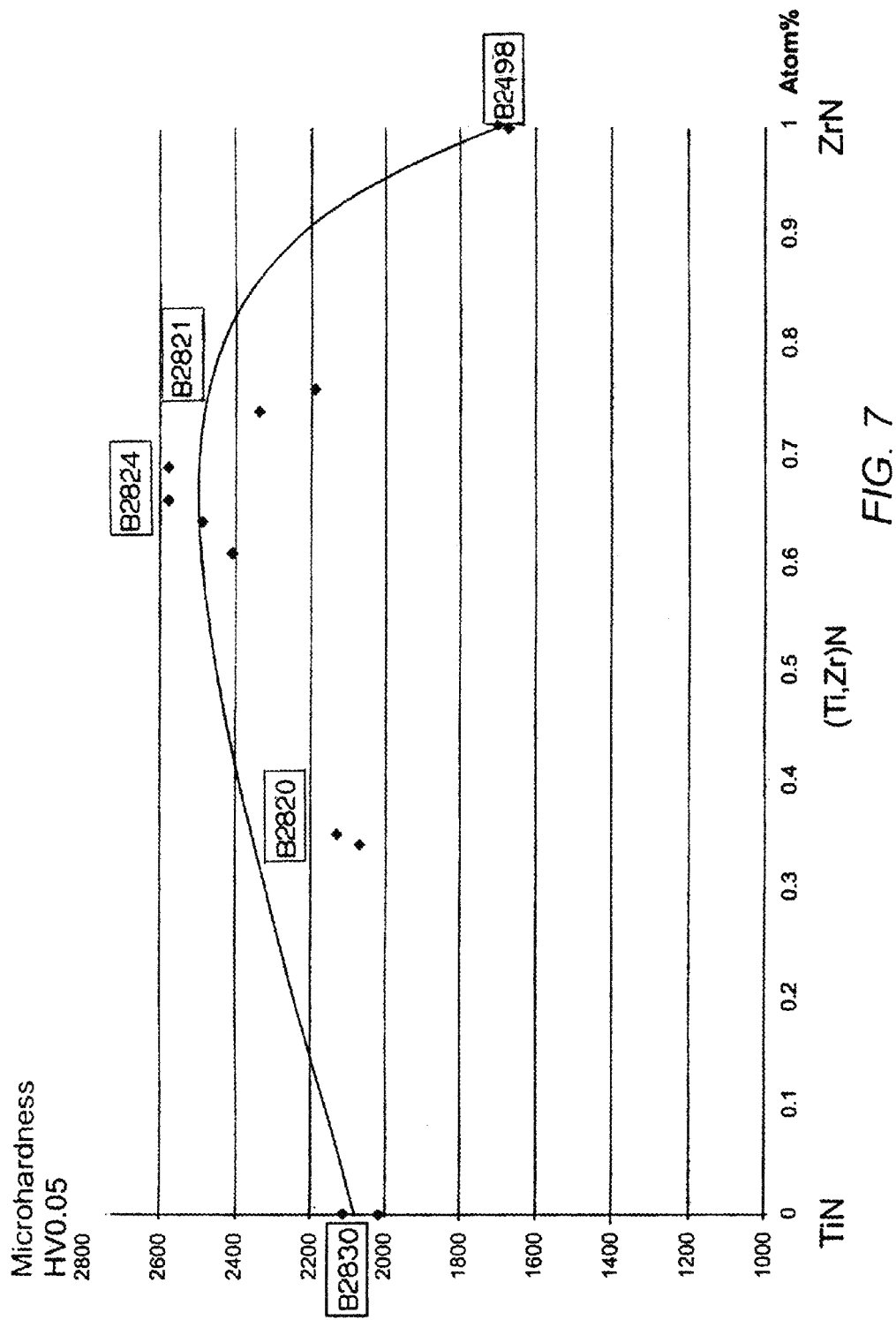
FIG. 7 is a plot of the composition (TiN—(Ti,Zr)N—ZrN) of the $(Ti_{1-x}, Zr_x)N$ coating layers verses the microhardness (HV0.05) of the $(T_{1-x}Zr_x)N$ coating layer for selected examples.

FIG. 7 is a plot of the composition (TiN—(Ti,Zr)N—ZrN) in atomic percent verses the microhardness (HV0.05) of selected examples of inventive CVD-coated cutting inserts. The FIG. 7 plot shows five samples wherein B2830 is a non-inventive TiN only coating layer and B2498 is a non-inventive ZrN only coating layer. The other three coating layers are inventive $(T_{1-x}Zr_x)N$ coating layers with varying contents of Ti and Zr. The value of x is along the horizontal axis of the FIG. 7 plot. The microhardness HV0.05 of the sample B2820, which is about a $(Ti_{0.67}Zr_{0.33})N$ coating layer, is about the same as the microhardness HV0.05 of the TiN coating layer. FIG. 7 shows that the microhardness HV0.05 of the inventive (Ti, Zr)N coating layer increases as the Ti content decreases and the Zr content increases as demonstrated by Sample B2824 coating layer $((T_{1-x}Zr_x)N$ with x=0.66) and Sample B2821 coating layer $((T_{1-x}Zr_x)N$ with x=0.76). The Zr atomic percentages equals between about 0.60 and about 0.75 while the Ti atomic percentages equals between about 0.25 and 0.40. The highest microhardness HV0.05 is between about 2400 and about 2500 for a composition in which the Zr equals between about 0.60 and 0.66 and the Ti content equals between about 0.34 and 0.40. FIG. 7 shows that the microhardness drops off dramatically with a ZrN coating layer.

Figure 8:
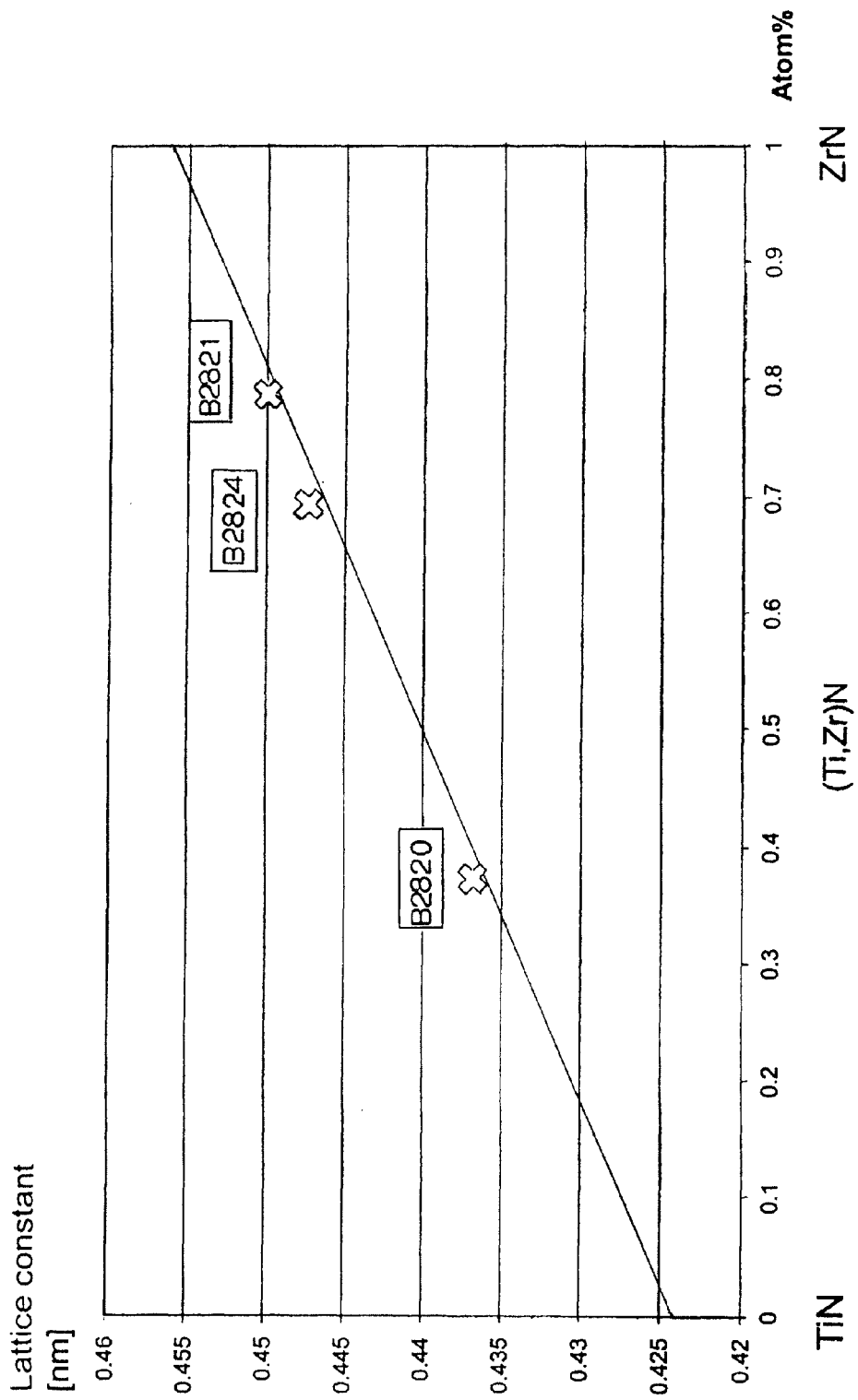
FIG. 8 is a plot of the composition (TiN—(Ti,Zr)N—ZrN) of the $(Ti_{1-x}, Zr_x)N$ coating layers verses the lattice constant (nanometers) of the $(T_{1-x}Zr_x)N$ coating layer for selected examples.

FIG. 8 is a plot of the composition (TiN—(Ti,Zr)N—ZrN) in atomic percent verses the lattice constant (nanometers) for selected examples of inventive CVD-coated $(T_{1-x}Zr_x)N$ cutting inserts. The FIG. 8 plot shows that the lattice constant increases as the Zr content increases and Ti content decreases. The value of x is along the horizontal axis of FIG. 8 plot. FIG. 8 shows that specific examples are B2820, B2824 and B2821 wherein the lattice constants and compositions are: B2820 has a composition of $(Ti_{0.67}Zr_{0.33})N$ with a lattice constant equal to 0.437 nm; B2824 has a composition of $(Ti_{0.34}Zr_{0.66})N$ with a lattice constant equal to 0.447 nm; and B2821 has a composition of $(Ti_{0.24}Zr_{0.76})N$ with a lattice constant equal to 0.449 nm. The impact of an increase in the lattice constant (nm) with an increase in the Zr content of the $(T_{1-x}Zr_x)N$ coating layer is linear in that there is a linear relationship between the lattice constant and the Zr content of the $(T_{1-x}Zr_x)N$ coating layer.

Figure 9:
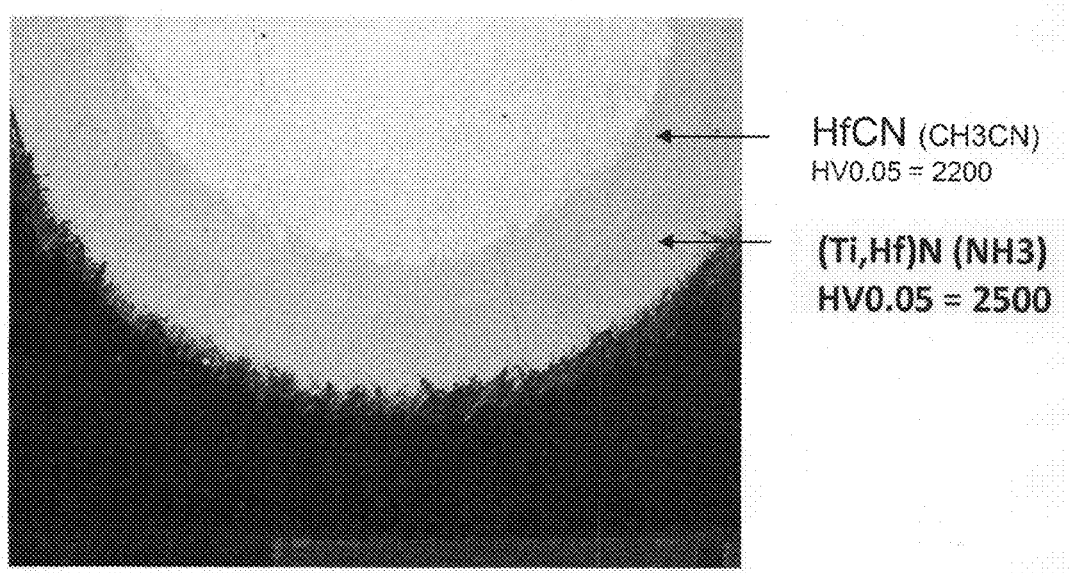
FIG. 9 is a photomicrograph with a magnification of 100× showing the coating layers of the coating scheme and substrate of a specific embodiment [Sample B2827] of the inventive CVD-coated article.

FIG. 9 is a photomicrograph with a magnification of 100× showing the coating scheme of a specific embodiment [Sample B2827] of an inventive CVD-coated cutting insert. The outer coating layer is (Ti,Hf)N and is light orange in color and has a composition of $(T_{1-x}Hf_x)N$ with x=0.5. The $(T_{1-x}Hf_x)N$ coating layer has a microhardness HV0.05 equal to 2500 and a thickness equal to 3.1 micrometers (μm). The coating scheme of FIG. 9 has a base coating layer of HfCN, which has a color slightly darker than the light orange color of the $(T_{1-x}Hf_x)N$ coating layer. The HfCN coating layer has a microhardness HV0.05 equal to 2200, and a thickness equal to 1.3 micrometers (μm). The chemical equilibrium reaction is: $\frac{1}{2}TiCl_4 + \frac{1}{2}HfCl_4 + NH_3 + \frac{1}{2}H_2 \rightarrow (Ti_{0.5}Hf_{0.5})N + 4HCl$.

Figure 10A:
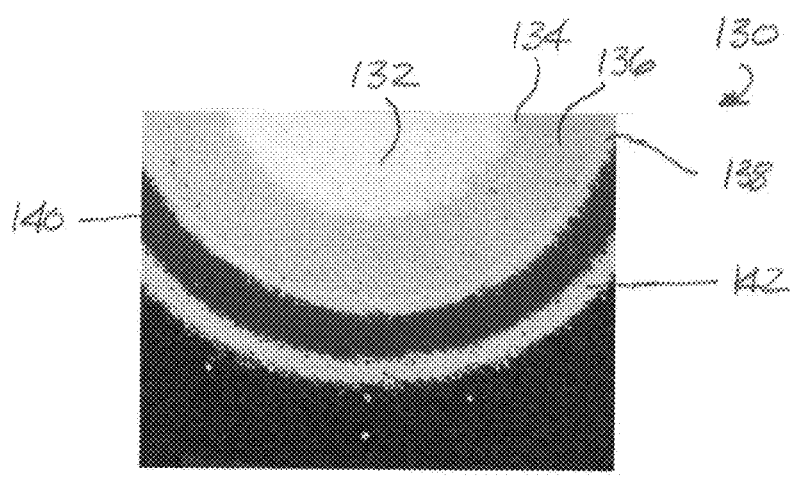
FIG. 10A is a photomicrograph with a magnification of 100× showing the coating scheme of Sample B2834.
Figure 10:
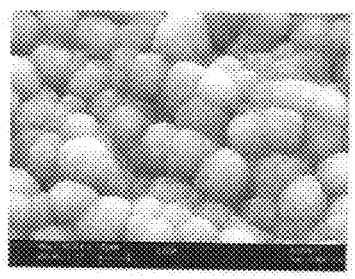
FIG. 10 is a SEM picture with a magnification of 10,000× (and a 1 μm scale) showing the surface grain morphology of a specific embodiment [Sample B2834] of the inventive CVD-coated article.

FIG. 10 is a SEM picture with a magnification of 10,000× showing the surface grain morphology of a specific embodiment [Sample B2834] of a CVD-coated cutting insert generally designated as 130 (see FIG. 10A). Referring to FIG. 10A, the Sample B2834 cutting insert 130 has a substrate 132, and the following coating scheme: a base coating layer 134 of TiN (0.2 μm thick), an inner mediate coating layer 136 of MT-TiCN (3.7 μm thick), an I.L. coating layer 138 (0.7 μm thick), an outer mediate coating layer 140 of α-Al2O3 (2.8 μm thick), and an outer coating layer 142 of $T_{1-x}Hf_x)N$ with x=0.1 (1.7 μm thick). The overall thickness of the coating scheme is 9.1 μm thick.

Figure 11:
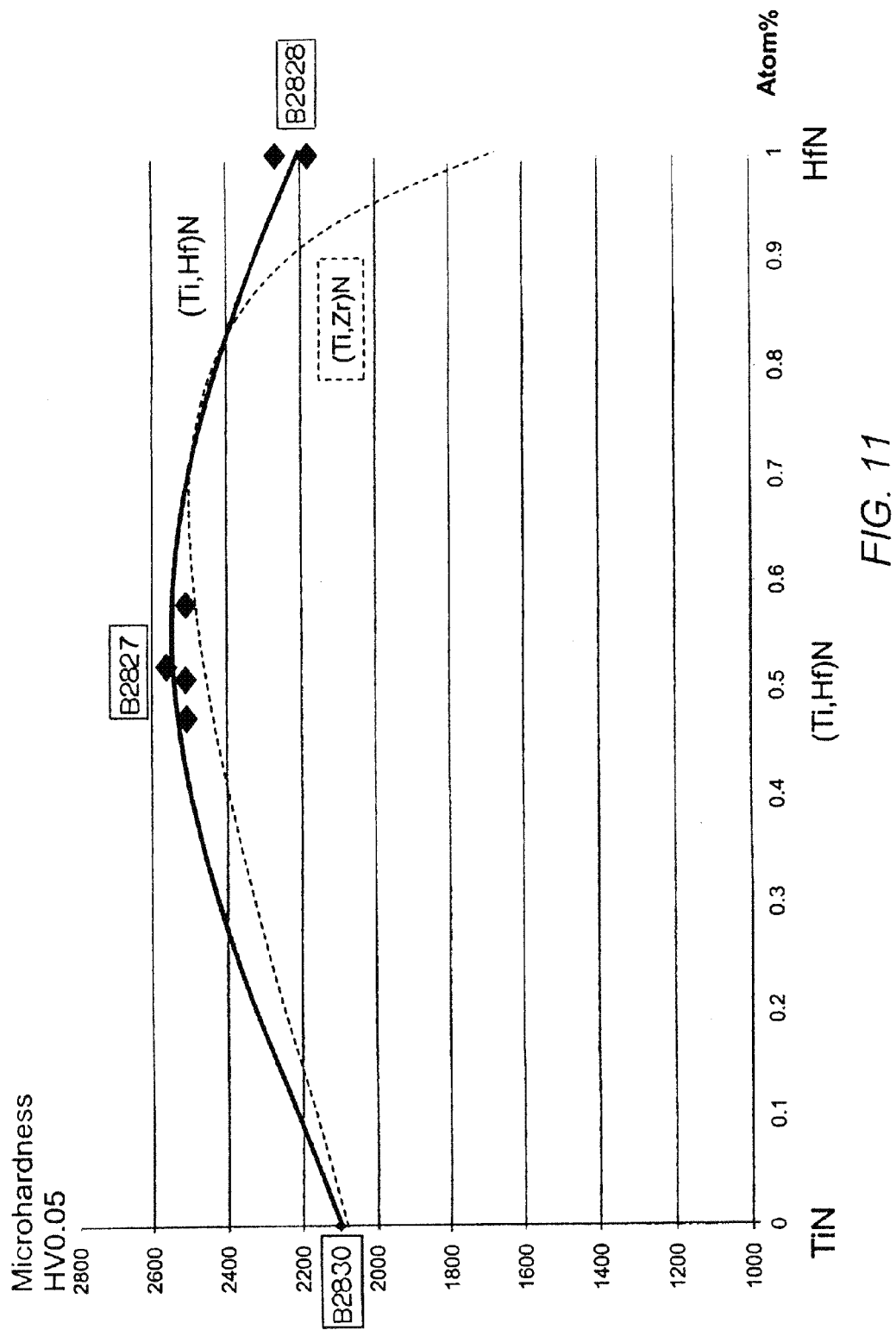
FIG. 11 is a plot of the composition (TiN—(Ti,Hf)N—HfN) in atomic percent verses the microhardness (HV0.05) of the $(T_{1-x}Hf_x)N$ coating layer for selected examples.

FIG. 11 is a plot of the composition (TiN—(Ti,Hf)N—HfN) in atomic percent verses the microhardness (HV0.05) of selected CVD-coated cutting inserts. The FIG. 11 plot shows that the microhardness HV0.05 increases from a non-inventive TiN coating layer (Sample B2830) to an inventive $(T_{1-x}Hf_x)N$ coating layer (Sample B2827) wherein the Ti content equals between about 0.45 to about 0.60 and the Hf content equals between about 0.40 to about 0.55. The value of x is along the horizontal axis. The microhardness drops off at a non-inventive composition of HfN only (Sample B2828).

Figure 12:
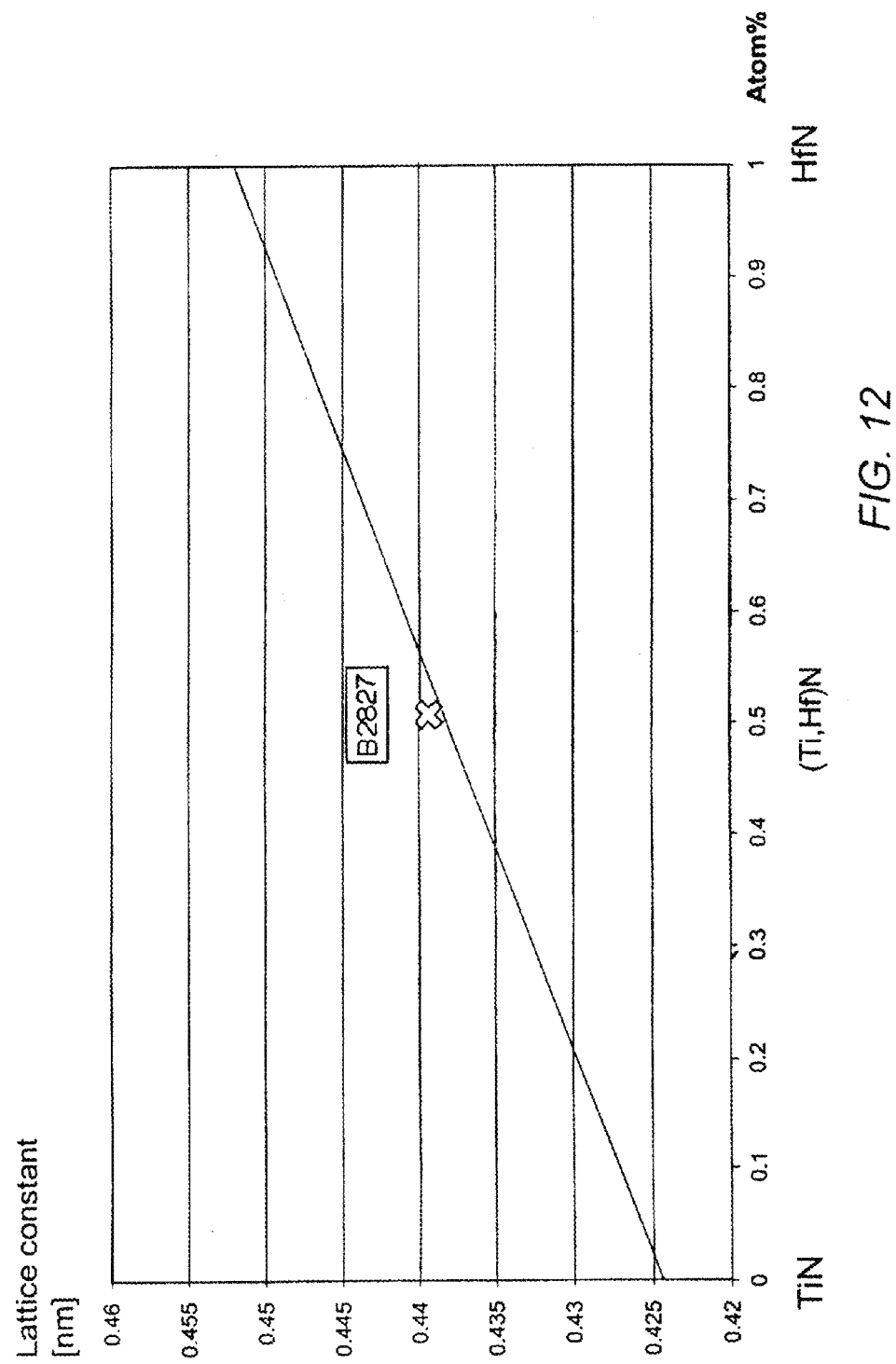
FIG. 12 is a plot of the composition (TiN—(Ti,Hf)N—HfN) in atomic percent verses the lattice constant (nanometers) of the $(T_{1-x}Hf_x)N$ coating layer for selected examples.

FIG. 12 is a plot of the composition (TiN—(Ti,Hf)N—HfN) in atomic percent verses the lattice constant (nanometers) for a selected CVD-coated cutting insert (Sample B2827), which has a composition $(Ti_{0.5}Hf_{0.5})N$. While the FIG. 12 plot shows a single lattice constant for Sample B2827, there is an extrapolation that the lattice constant increases with an increase in the hafnium content of the (Ti, Hf)N coating layer.

For all of the measurements as set forth herein, the x-ray diffraction system was as follows: Equipment: Rigaku MiniFlex 600 X-ray tube and scintillation counter; Radiation: Cu Ka; Angle range: 20 to 80 degree; Step size: 0.04° and Step time: 2°/min. The lattice constant for face centered cubic crystals can be calculated according to Bragg Law. For the microhardness measurements the following was used: Equipment: Shimadzu HMV-2000, Vickers diamond indenter, and Weight: 50 g. The Vickers Hardness is calculated as: $HV=1.854 F/d^2$ (F=test load kgf, d=indentation diagonal length mm). The microhardness is designated as HV0.05. The hardness tests were made on calotte scars of the coatings.

Figure 13:
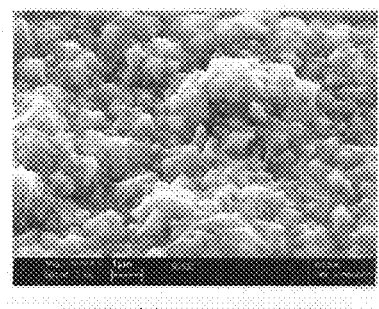
FIG. 13 is a SEM picture of a prior art CVD-coated article [Sample B2832] with a magnification of 10,000× (and a 1 μm scale) showing the surface grain morphology.
Figure 13A:
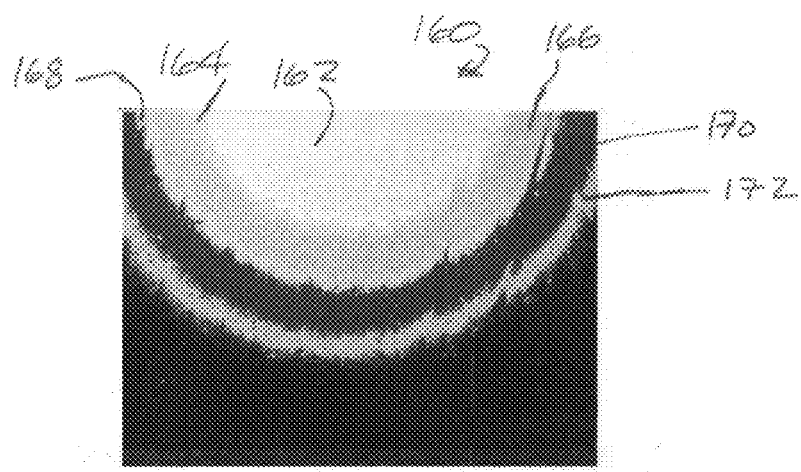
FIG. 13A is a photomicrograph with a magnification of 100× showing the coating scheme of Sample B2832.

FIG. 13 is a SEM picture of a prior art non-inventive CVD-coated article [Sample B2832] showing the surface grain morphology. Referring to FIG. 13A, Sample B2832 (generally designated as 160) has a substrate 162 (see FIG. 13A), and the following coating scheme: a base coating layer 164 of TiN (0.1 μm thick), an inner mediate coating layer 166 of MT-TiCN (3.7 μm thick), an I.L. coating layer 168 (0.6 μm thick), an outer mediate coating layer 170 of α-Al2O3 (3.2 μm thick), and an outer coating layer 172 of ZrCN (1.6 μm thick). The overall thickness of the coating scheme is equal to 9.2 μm. The surface grain morphology is fine grained.

Figure 14:
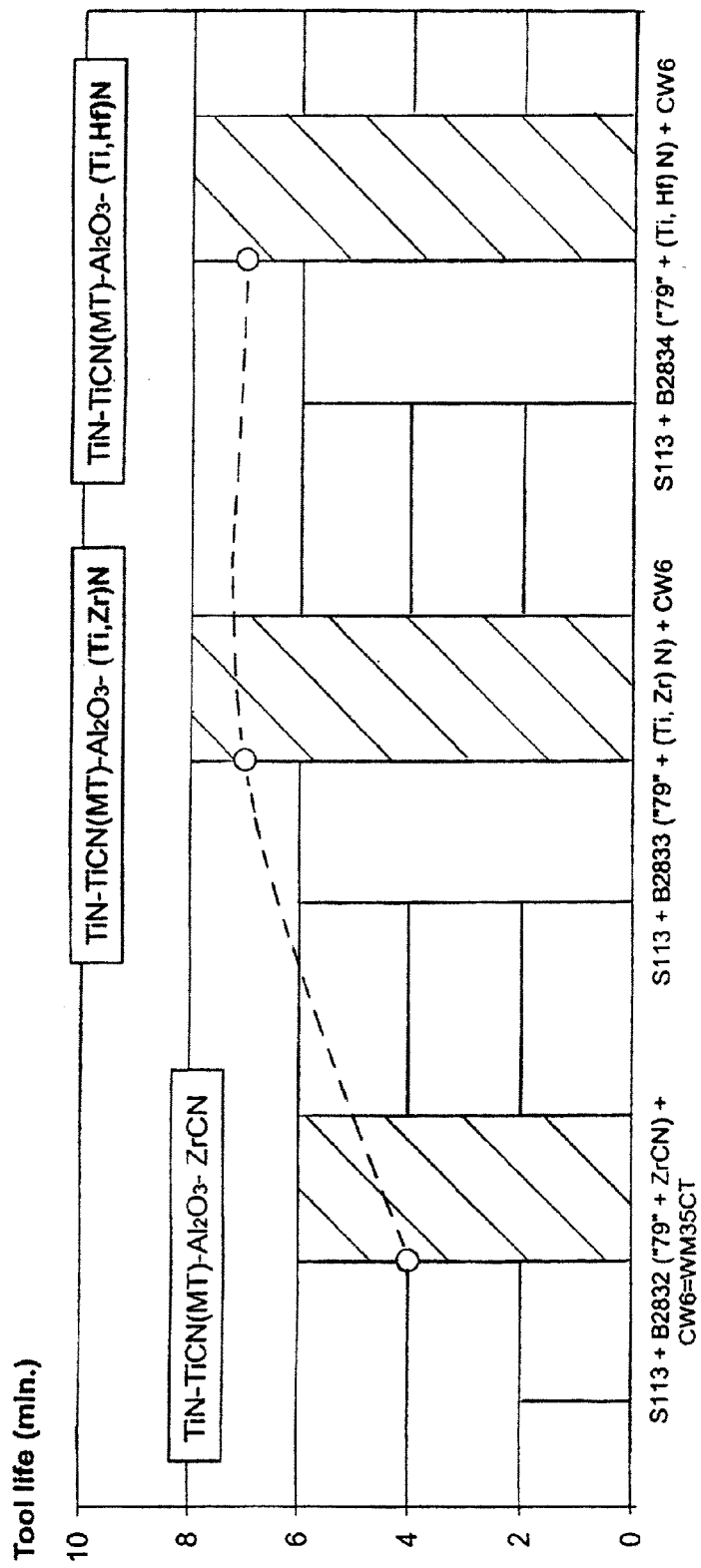
FIG. 14 is a plot showing the tool life (minutes) for selected samples of CVD-coated cutting inserts including inventive CVD-coated cutting inserts.

FIG. 14 is a plot showing the tool life (minutes) in a continuous turning test for selected samples of CVD-coated CNMG432RP (angle=95°) cutting inserts (Samples B2832, B2833 and B2834). The cutting conditions are: vc=160 meters/minute; f=0.25 mm/U; ap=2.5 mm; workpiece material was stainless steel (X5 Cr Ni 18 10); and dry turning.

FIG. 14 shows that the tool life increases for the CVD-coated cutting inserts that contain an outer coating layer of (Ti, Zr)N or (Ti, Hf)N as compared to a CVD-coated cutting insert with a ZrCN coating layer. The increase in tool life is significant in that the increase is about a 75% percent increase from about 4 minutes with the conventional Sample B2832 to about 7 minutes with the inventive Samples B2833 and B2834. This increase demonstrates the advantage connected with the use of the $(T_{1-x}Zr_x)N$ coating layer and the $(T_{1-x}Hf_x)N$ coating layer in a coating scheme for CVD-coated cutting insert. This advantage is especially the case with the dry turning of a stainless steel workpiece.

Referring to specific examples, there are four samples that include a coating layer of (Ti, Zr)N, and these are: B2824, B2820, B2821, and B2833. The processing parameters for each of these samples are set forth below in the respective Tables. In reference to Tables 4 through 9, the gas composition is set forth in volume percent of the gaseous mixture, the temperature is in degrees Centigrade, the pressure is in mbar, the time is in minutes, and the thickness is in pin.

TABLE 4

Processing Parameters for Sample B2824

| Substrate Coating Layers | Gas Composition (Volume Percent) | Temp. (° C.) | Pressure (mbar) | Time (min.) | Thickness (μm) |
|---|---|---|---|---|---|
| ZrCN on the surface of the substrate | H2 (rest %) + ZrCl4(0.8%) + CH3CN(0.4%) + N2(20%) + Ar(3%) | 900° C. | 80 mbar | 120 min | 1.7 μm |
| $(Ti_{1-x} Zr_x)N$ with x = 0.66 on the surface of the ZrCN coating layer | H2(rest %) + TiCl4(0.3%) + ZrCl4(0.5%) + NH3(0.7%) + N2(33.5%) + Ar(2%) | 870° C. | 80 mbar | 120 min | 3.2 μm |

TABLE 5

Processing Parameters for Sample B2820

| Substrate Coating Layers | Gas Composition (Volume Percent) | Temp. (° C.) | Pressure (mbar) | Time (min.) | Thickness (μm) |
|---|---|---|---|---|---|
| ZrCN on the surface of the substrate | H2 (rest %) + ZrCl4(0.8%) + CH3CN(0.4%) + N2(20%) + Ar(3%) | 900° C. | 80 mbar | 120 min | 1.7 μm |
| $(Ti_{1-x} Zr_x)N$ with x = 0.33 on the surface of the ZrCN coating layer | H2(rest %) + TiCl4(0.5%) + ZrCl4(0.5%) + NH3(0.7%) + N2(33.5%) + Ar(2%) | 870° C. | 80 mbar | 120 min | 3.6 μm |

TABLE 6

Processing Parameters for Sample B2821

| Substrate Coating Layers | Gas Composition (Volume Percent) | Temp. (° C.) | Pressure (mbar) | Time (min.) | Thickness (μm) |
|---|---|---|---|---|---|
| ZrCN on the surface of the substrate | H2 (rest %) + ZrCl4(0.8%) + CH3CN(0.4%) + N2(20%) + Ar(3%) | 900° C. | 80 mbar | 120 min | 1.5 μm |
| $(Ti_{1-x}Zr_x)N$ with x = 0.76 on the surface of the ZrCN coating layer | H2(rest) + TiCl4(0.15%) + ZrCl4(0.5%) + NH3(0.7%) + N2(33.5%) + Ar(2%) | 870° C. | 80 mbar | 60 min | 2.0 μm |

TABLE 7

Processing Parameters for Sample B2833

| Substrate Coating Layers | Gas Composition (Volume Percent) | Temp. (° C.) | Pressure (mbar) | Time (min.) | Thickness (μm) |
|---|---|---|---|---|---|
| TiN on the surface of the substrate | H2(rest) + N2(46%) + TiCl4(1.3%) | 950° C. | 700 mbar | 20 min | 0.3 μm |
| MT-TiCN on the surface of the TiN coating layer | H2(rest) + N2(30%) + TiCl4(1.5%) + CH3CN(0.5%) | 950° C. | 80 mbar | 60 min | 3.0 μm |
| TiOCN on the surface of the MT-TiCN coating layer | H2(rest) + N2(8.5%) + CO2(1.4%) + TiCl4(1.7%) + CH4(2.8%) | 970° C. | 80 mbar | 30 min | 0.3 μm |
| Al2O3 on the surface of the TiOCN coating layer | H2(rest %) + AlCl3(2.2%) + CO2(3.6%) + H2S(0.2%) + HCl(1.7%) | 990° C. | 80 mbar | 180 min | 3.9 μm |
| $(Ti_{1-x}Zr_x)N$ with x = 0.32 on the surface of the Al2O3 coating layer | H2(rest) + TiCl4(0.4%) + ZrCl4(0.5%) + NH3(0.7%) + N2(33.5%) + Ar(2%) | 870° C. | 80 mbar | 90 min | 1.9 μm |

In reference to the inventive (Ti, Hf)N coating layer, there are two samples that include a coating layer of (Ti, Hf)N, and these are: B2827 and B2834.

TABLE 8

Processing Parameters for Sample B2827

| Substrate Coating Layers | Gas Composition (Volume Percent) | Temp. (° C.) | Pressure (mbar) | Time (min.) | Thickness (μm) |
|---|---|---|---|---|---|
| HfCN on the surface of the substrate | H2(rest %) + HfCl4(0.8%) + CH3CN(0.4%) + N2(20%) + Ar(3%) | 900° C. | 80 mbar | 120 min | 1.3 μm |
| $(Ti_{1-x}Hf_x)N$ with x = 0.5 on the surface of the HfCN coating layer | H2(rest) + TiCl4(0.3%) + HfCl4(0.63%) + NH3(0.8%) + N2(16.7%) + Ar(2.5%) | 870° C. | 80 mbar | 180 min | 3.1 μm |

TABLE 9

Processing Parameters for Sample B2834

| Substrate Coating Layers | Gas Composition (Volume Percent) | Temp. (° C.) | Pressure (mbar) | Time (min.) | Thickness (μm) |
|---|---|---|---|---|---|
| TiN on the surface of the substrate | H2(rest) + N2(46%) + TiCl4(1.3%) | 950° C. | 700 mbar | 20 min | 0.2 μm |
| MT-TiCN on the surface of the TiN coating layer | H2(rest) + N2(30%) + TiCl4(1.5%) + CH3CN(0.5%) | 950° C. | 80 mbar | 60 min | 3.7 μm |

TABLE 9-continued

Processing Parameters for Sample B2834

| Substrate Coating Layers | Gas Composition (Volume Percent) | Temp. (° C.) | Pressure (mbar) | Time (min.) | Thickness (μm) |
|---|---|---|---|---|---|
| TiOCN on the surface of the MT-TiCN coating layer | H2(rest) + N2(8.5%) + CO2(1.4%) + TiCl4(1.7%) + CH4(2.8%) | 970° C. | 80 mbar | 30 min | 0.4 μm |
| Al2O3 on the surface of the TiOCN coating layer | H2(rest %) + AlCl3(2.2%) + CO2(3.6%) + H2S(0.2%) + HCl(1.7%) | 990° C. | 80 mbar | 180 min | 3.1 μm |
| $(Ti_{1-x}Hf_x)N$ with x = 0.1 on the surface of the Al2O3 coating layer | H2(rest) + TiCl4(0.4%) + HfCl4(0.5%) + NH3(0.7%) + N2(33.5%) + Ar(2%) | 870° C. | 80 mbar | 90 min | 1.7 μm |

Looking at the process parameters, it is apparent that there is disclosed a process for making a CVD-coated article. The process comprises the steps of: providing a substrate wherein the substrate has a substrate surface; and depositing a coating layer of $Ti_{1-x}Me_x$ nitride wherein Me is zirconium or hafnium or a mixture of zirconium and hafnium. The gaseous mixture to deposit zirconium comprises hydrogen and $TiCl_4$ and $ZrCl_4$ and $NH_3$ and nitrogen and argon. The gaseous mixture to deposit hafnium comprises hydrogen and $TiCl_4$ and $HfCl_4$ and $NH_3$ and nitrogen and argon The gaseous mixture to apply a mixture of zirconium and hafnium comprises hydrogen and TiCl4 and $ZrCl_4$ and $HfCl_4$ and $NH_3$ and nitrogen and argon. In the depositing step, the temperature equals between about 870° C. and about 900° C., the pressure equals between about 70 mbar and about 90 mbar, and the duration equals between about 90 minutes and about 180 minutes. There should be an appreciation that the $NH_3$ in the gaseous mixture can be replaced by hydrazine.

When the deposition is of a coating layer of $(Ti_{1-x}Zr_x)$ nitride, the gaseous mixture comprises $TiCl_4$ in an amount between about 0.1 volume percent and about 0.6 volume percent of the gaseous mixture, $ZrCl_4$ in an amount between about 0.3 volume percent and about 0.6 volume percent of the gaseous mixture, $NH_3$ in an amount between about 0.6 volume percent and about 0.8 volume percent of the gaseous mixture, nitrogen in an amount between about 30 volume percent and about 35 volume percent of the gaseous mixture, argon in an amount between about 1 volume percent and about 3 volume percent of the gaseous mixture, and hydrogen in an amount between about 60 volume percent and about 68 volume percent of the gaseous mixture. Further, the value of x of the $(Ti_{1-x}Zr_x)$ nitride can be between about 0.30 and about 0.35. Additionally, the value of x of the $(Ti_{1-x}Zr_x)$ nitride can be between about 0.60 and about 0.80.

When the deposition is of a coating layer of $(Ti_{1-x}Hf_x)$ nitride, the gaseous mixture comprises $TiCl_4$ in an amount between about 0.2 volume percent and about 0.5 volume percent of the gaseous mixture, $HfCl_4$ in an amount between about 0.4 volume percent and about 0.7 volume percent of the gaseous mixture, $NH_3$ in an amount between about 0.6 volume percent and about 0.9 volume percent of the gaseous mixture, nitrogen in an amount between about 15 volume percent and about 35 volume percent of the gaseous mixture, argon in an amount between about 1 volume percent and about 3 volume percent of the gaseous mixture, and hydrogen in an amount between about 59.9 volume percent and about 82.8 volume percent of the gaseous mixture. Further, the value of x of the $(Ti_{1-x}Hf_x)$ nitride can be between about 0.1 and about 0.6.

It is apparent that the present inventive CVD-coated articles provide advantages, especially that result in an increase in tool life for a CVD-coated cutting insert.

While some embodiments of the present invention have been shown and described, it will be understood to those skilled in the art that changes and modifications may be made thereto without departing from the spirit and scope of the present invention as described in the following claims. It is to be understood that the fact that a certain number of preferred embodiments are described herein does not in any way limit the scope of the present invention as set forth in the appended claims. All patent applications, patents, and all other publications referenced herein are incorporated herein in their entireties to the full extent permitted by law.

What is claimed is:

1. A CVD-coated article comprising:
   a substrate having a substrate surface;
   a thermal CVD coating scheme on the substrate surface, and the coating scheme comprising a coating layer of $Ti_{1-x}Me_x$ nitride wherein Me is selected from the group consisting essentially of zirconium or hafnium or a mixture of zirconium and hafnium, and x equals between about 0.1 and about 0.9;
   the coating layer of $Ti_{1-x}Me_x$ nitride has a microhardness equal to between about 2300 HV0.05 and about 2600 HV0.05; and
   the coating layer of $Ti_{1-x}Me_x$ nitride has a face centered cubic crystal structure; and
   the coating layer of $Ti_{1-x}Me_x$ nitride has a lattice constant equal to between about 0.427 nanometers and about 0.453 nanometers.

2. The CVD-coated article according to claim 1 wherein the thermal CVD coating scheme further has a coating layer of Me carbonitride, and the coating layer of $Ti_{1-x}Me_x$ nitride is on the coating layer of Me carbonitride, and the coating layer of Me carbonitride is on the substrate surface.

3. The CVD-coated article according to claim 1 wherein the thermal CVD coating scheme further has a base coating layer of titanium nitride, an inner mediate coating layer of MT-TiCN, an outer mediate coating layer of alumina, and the coating layer of $Ti_{1-x}Me_x$ nitride is on the coating layer of alumina.

4. The CVD-coated article according to claim 1 wherein the thermal CVD coating scheme further has a base coating layer of titanium nitride, and an outer coating layer of alumina, and the coating layer of $Ti_{1-x}Me_x$ nitride is on the base coating layer of titanium nitride, and the outer coating layer of alumina is on the coating layer of $Ti_{1-x}Me_x$ nitride.

5. The CVD-coated article according to claim 1 wherein Me consists essentially of zirconium wherein the coating layer of $Ti_{1-x}Me_x$ nitride is a coating layer of $Ti_{1-x}Zr_x$ nitride, and x equals between about 0.1 and about 0.9.

6. The CVD-coated article according to claim 5 wherein the thermal CVD coating scheme further has a base coating layer of titanium nitride, an inner mediate coating layer of MT-TiCN, an outer mediate coating layer of alumina, and the coating layer of $Ti_{1-x}Zr_x$ nitride is on the coating layer of alumina.

7. The CVD-coated article according to claim 5 wherein the thermal CVD coating scheme further has a base coating layer of titanium nitride, and an outer coating layer of alumina, and the coating layer of $Ti_{1-x}Zr_x$ nitride is on the base coating layer of titanium nitride, and the outer coating layer of alumina is on the coating layer of nitride.

8. The CVD-coated article according to claim 5 wherein x equals between about 0.4 and about 0.8.

9. The CVD-coated article according to claim 1 wherein Me consists essentially of hafnium wherein the coating layer of $Ti_{1-x}Me_x$ nitride is a coating layer of $Ti_{1-x}Hf_x$ nitride, and x equals between about 0.1 and about 0.9, and the lattice constant equal between about 0.427 and about 0.445.

10. The CVD-coated article according to claim 9 wherein the thermal CVD coating scheme further has a base coating layer of titanium nitride, an inner mediate coating layer of MT-TiCN, an outer mediate coating layer of alumina, and the coating layer of $Ti_{1-x}Hf_x$ nitride is on the coating layer of alumina.

11. The CVD-coated article according to claim 9 wherein the thermal CVD coating scheme further has a base coating layer of titanium nitride, and an outer coating layer of alumina, and the coating layer of $Ti_{1-x}Hf_x$ nitride is on the base coating layer of titanium nitride, and the outer coating layer of alumina is on the coating layer of $Ti_{1-x}Hf_x$ nitride.

12. The CVD-coated article according to claim 9 wherein x equals between about 0.3 and about 0.7.

13. The CVD-coated article according to claim 1 wherein Me consists essentially of zirconium and hafnium wherein the coating layer of $Ti_{1-x}Me_x$ nitride is a coating layer of $Ti_{1-(a+b)}Zr_aHf_b$ nitride, and a equals between about 0.1 and about 0.9 and b equals between about 0.1 and about 0.9.

14. The CVD-coated article according to claim 13 wherein the thermal CVD coating scheme further has a base coating layer of titanium nitride, an inner mediate coating layer of MT-TiCN, an outer mediate coating layer of alumina, and the coating layer of $Ti_{1-(a+b)}Zr_aHf_b$ nitride is on the coating layer of alumina.

15. The CVD-coated article according to claim 13 wherein the thermal CVD coating scheme further has a base coating layer of titanium nitride, and an outer coating layer of alumina, and the coating layer of $Ti_{1-(a+b)}Zr_aHf_b$ nitride is on the base coating layer of titanium nitride, and the outer coating layer of alumina is on the coating layer of $Ti_{1-(a+b)}Zr_aHf_b$ nitride.

16. The CVD-coated article according to claim 13 wherein a equals between about 0.3 and about 0.7, b equal between about 0.3 and about 0.7.

17. The CVD-coated article according to claim 1 wherein the article is a cutting insert.

18. The CVD-coated article of claim 1, wherein Me is zirconium and $0.6 \leq x \leq 0.75$.

19. The CVD-coated article of claim 1, wherein Me is zirconium and $0.7 \leq x \leq 0.8$.

20. The CVD-coated article of claim 1, wherein Me is hafnium and $0.4 \leq x \leq 0.55$.

21. The CVD coated article of claim 1, wherein Me is a mixture of zirconium and hafnium.

22. A CVD-coated article comprising:
a substrate having a substrate surface;
a thermal CVD coating scheme on the substrate surface, and the coating scheme comprising a coating layer of $Ti_{1-x}Zr_x$ nitride wherein x equals between about 0.1 and about 0.9;
the coating layer of $Ti_{1-x}Zr_x$ nitride has a microhardness equal to between about 2300 HV0.05 and about 2600 HV0.05;
the coating layer of $Ti_{1-x}Zr_x$ nitride has a face centered cubic crystal structure; and the coating layer of $Ti_{1-x}Zr_x$ nitride has a lattice constant equal to between about 0.427 nanometers and about 0.453 nanometers.

23. A CVD-coated article comprising:
a substrate having a substrate surface;
a thermal CVD coating scheme on the substrate surface, and the coating scheme comprising a coating layer of $Ti_{1-x}Hf_x$ nitride wherein x equals between about 0.1 and about 0.9;
the coating layer of $Ti_{1-x}Hf_x$ nitride has a microhardness equal to between about 2300 HV0.05 and about 2600 HV0.05;
the coating layer of $Ti_{1-x}Hf_x$ nitride has a face centered cubic crystal structure; and the coating layer of $Ti_{1-x}Hf_x$ nitride has a lattice constant equal to between about 0.427 nanometers and about 0.449 nanometers.

* * * * *